(12) United States Patent
Braun et al.

(10) Patent No.: US 7,299,151 B2
(45) Date of Patent: Nov. 20, 2007

(54) MICRODEVICE PROCESSING SYSTEMS AND METHODS

(75) Inventors: David M. Braun, Corvallis, OR (US); Deanna J. Bergstrom, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 249 days.

(21) Appl. No.: 10/771,495

(22) Filed: Feb. 4, 2004

(65) Prior Publication Data

US 2005/0182594 A1    Aug. 18, 2005

(51) Int. Cl.
G01B 5/02    (2006.01)
(52) U.S. Cl. ...................................... 702/170
(58) Field of Classification Search ............. 702/170; 205/118; 134/1.3; 438/149, 9, 16; 347/65, 347/44; 451/6, 288, 8
See application file for complete search history.

(56) References Cited

U.S. PATENT DOCUMENTS

| 6,159,075 | A | 12/2000 | Zhang | |
|---|---|---|---|---|
| 6,271,047 | B1 | 8/2001 | Ushio et al. | |
| 6,656,755 | B1 * | 12/2003 | Ohkawa | 438/16 |
| 2001/0008827 | A1 * | 7/2001 | Kimura et al. | 451/8 |
| 2001/0012108 | A1 | 8/2001 | Holzapfel et al. | |
| 2001/0023167 | A1 * | 9/2001 | Kimura et al. | 451/288 |
| 2002/0001861 | A1 * | 1/2002 | Ohuchi | 438/9 |
| 2002/0173084 | A1 * | 11/2002 | Ohkawa | 438/149 |
| 2002/0186381 | A1 | 12/2002 | Subrahmanyan et al. | |
| 2003/0085951 | A1 * | 5/2003 | Keenan et al. | 347/44 |
| 2004/0182416 | A1 * | 9/2004 | Allen et al. | 134/1.3 |
| 2004/0229389 | A1 | 11/2004 | Joei | |
| 2004/0235392 | A1 * | 11/2004 | Ohta | 451/6 |
| 2005/0023145 | A1 * | 2/2005 | Cohen et al. | 205/118 |
| 2005/0036004 | A1 * | 2/2005 | Horn et al. | 347/65 |

FOREIGN PATENT DOCUMENTS

| GB | 2384753 A | 8/2003 |
|---|---|---|
| GB | 2393147 A | 5/2006 |
| JP | 10160420 | 6/1988 |
| JP | 5062952 A | 3/1993 |
| WO | WO2003/070415 | 8/2003 |
| WO | WO2005/016649 | 2/2005 |

* cited by examiner

Primary Examiner—John Barlow
Assistant Examiner—Xiuqin Sun

(57) ABSTRACT

Mircodevice processing systems. One exemplary embodiment includes a component for removing substrate material to form a feature into a first surface of a substrate, and a component for measuring a thickness of a portion of the substrate defining the feature, wherein the component for measuring is positioned proximate a second surface of the substrate that is different than the first surface.

16 Claims, 9 Drawing Sheets

MICRODEVICE PROCESSING SYSTEMS AND METHODS

BACKGROUND

Microdevices including microchips and microelectromechanical systems (MEMS) devices are ubiquitous in society. Microdevices are incorporated into a broad array of consumer products. The market for microdevices and the consumer products which incorporate them continually demands increased performance at decreased costs. In order to meet these requirements the microdevices may be made more efficiently and to closer tolerances.

Maintaining design parameters during processing can allow higher performing microdevices to be produced. Design parameters can be maintained, at least in part, by accurate measurement of microdevice components during processing. As such a desire exists for enhanced measuring capabilities of microdevice components.

BRIEF DESCRIPTION OF THE DRAWINGS

The same components are used throughout the drawings to reference like features and components wherever feasible.

DETAILED DESCRIPTION OF THE PREFERRED EMBODIMENTS

The embodiments described below pertain to methods and systems for measuring various dimensions of a microdevice during processing. The microdevice can comprise various components which are processed to produce a functional microdevice. Some forms of microdevice processing can add and/or remove material to a base substrate material to form a functional microdevice. The described embodiments can allow dimensions such as thicknesses of the various materials to be determined. Some embodiments allow such dimensions to be determined during processing.

In one embodiment a removal process can be utilized to form a feature through a substrate having one or more layers positioned thereon. Measuring substrate material remaining between the feature and the layers can allow the feature to be completed through the substrate with a decreased risk of damaging the layers.

Several examples are described for forming a microdevice comprising a fluid-ejecting device. In these examples the fluid-ejecting device comprises an ink jet print head. One or more processing steps can be used to form a feature in the substrate of the ink jet print head. Various processing steps can be utilized to increase a depth of the feature until it passes entirely through the substrate's thickness. The various components described below may not be illustrated accurately as far as their size is concerned. Rather, the included figures are intended as diagrammatic representations to illustrate to the reader various inventive principles that are described herein.

Examples of particular feature size, shape, and arrangement are depicted herein. However any type of feature size and geometry may be fabricated using the inventive methods and apparatuses described herein. In addition, while the described embodiments herein describe and discuss ink jet print cartridges, the inventive methods and apparatuses described herein can be used in order to fabricate other microdevices.

EXEMPLARY PRODUCTS

Figure 1:
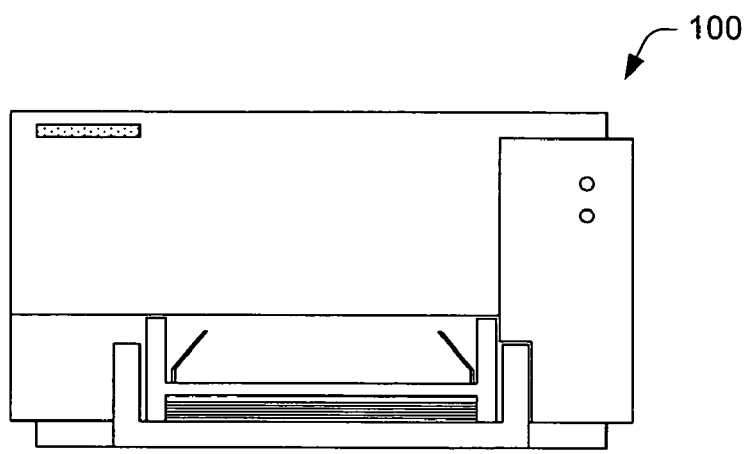
FIG. 1 illustrates a representation of a front elevational view of an exemplary printer in accordance with one exemplary embodiment.
Figure 2:
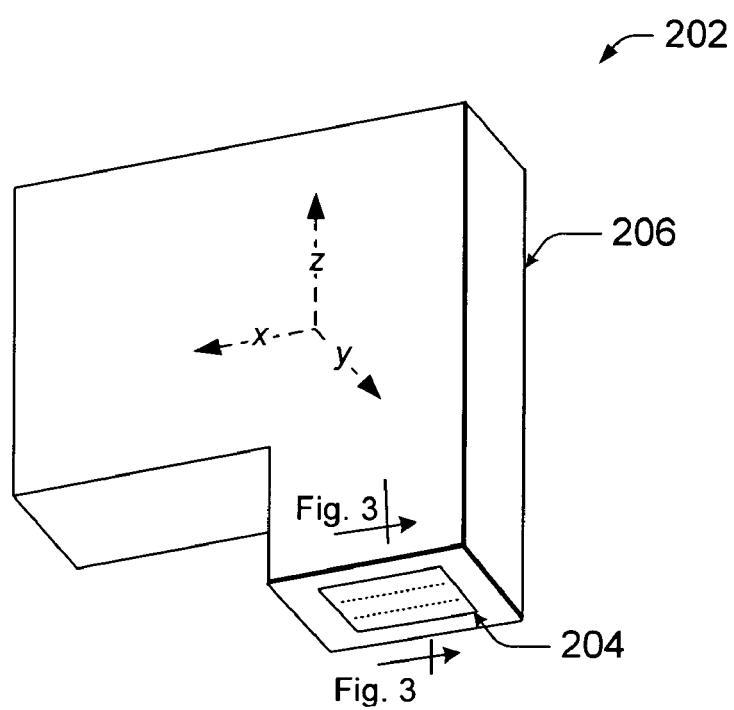
FIG. 2 illustrates a representation of a perspective view of a print cartridge suitable for use in an exemplary printer in accordance with one exemplary embodiment.

FIGS. 1-2 illustrate examples of products which can be produced utilizing at least some of the described embodiments. FIG. 1 shows a diagrammatic representation of an exemplary printing device that can utilize an exemplary print cartridge. In this embodiment the printing device comprises a printer 100. The printer shown here is embodied in the form of an inkjet printer. The printer 100 can be capable of printing in black-and-white and/or in color. The term "printing device" refers to any type of printing device and/or image forming device that employs slotted substrate(s) to achieve at least a portion of its functionality. Examples of such printing devices can include, but are not limited to, printers, facsimile machines, and photocopiers. In this exemplary printing device the slotted substrates comprise a portion of a print head which is incorporated into a print cartridge, an example of which is described below.

FIG. 2 shows a diagrammatic representation of an exemplary print cartridge 202 that can be utilized in an exemplary printing device. The print cartridge is comprised of a print head 204 and a cartridge body 206 that supports the print head. Though a single print head 204 is employed on this print cartridge 202 other exemplary configurations may employ multiple print heads on a single cartridge.

Print cartridge 202 is configured to have a self-contained fluid or ink supply within cartridge body 206. Other print cartridge configurations alternatively or additionally may be configured to receive fluid from an external supply. Other exemplary configurations will be recognized by those of skill in the art.

Figure 3:
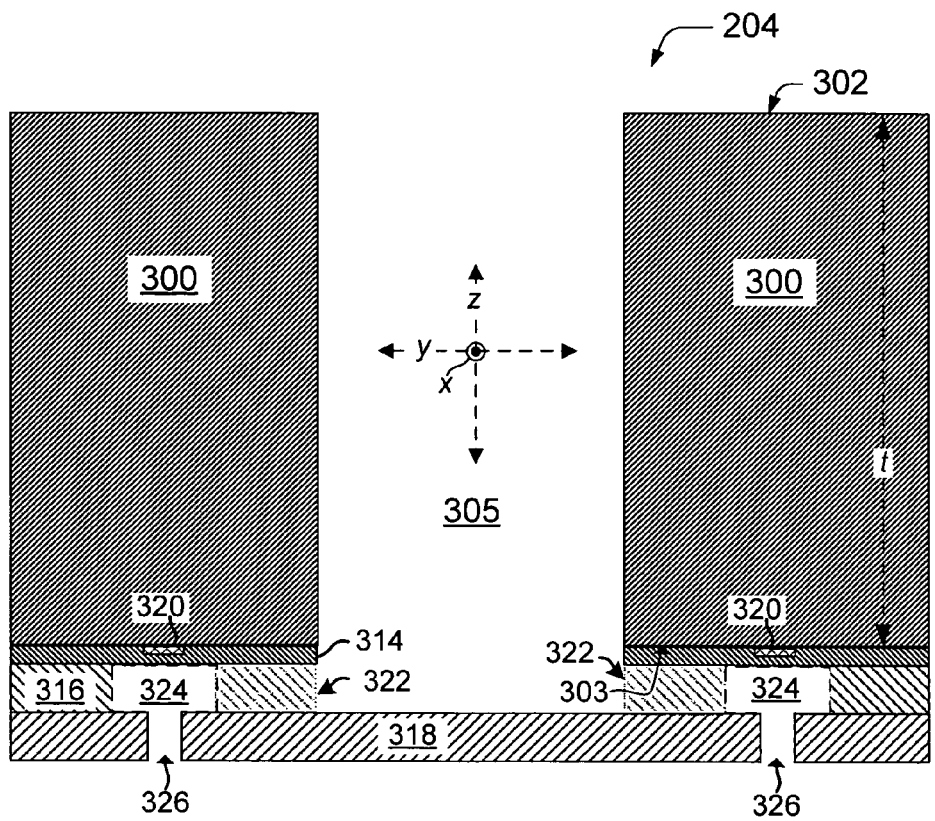
FIG. 3 illustrates a representation of a cross-sectional view of a portion of a print cartridge in accordance with one exemplary embodiment.

FIG. 3 shows a cross-sectional diagrammatic representation of a portion of the exemplary print head 204, taken along line 3-3 in FIG. 2. The view of FIG. 3 is taken transverse an x-axis of a fluid-feed slot (described below), the x-axis extending into and out of the plane of the page upon which FIG. 3 appears.

Here a substrate 300 extends between a first substrate surface ("first surface") 302 and a second substrate surface ("second surface") 303. A slot 305 passes through substrate 300 between first and second surfaces 302, 303.

In this particular embodiment substrate 300 comprises silicon which either can be doped or undoped. Other substrate materials can include, but are not limited to, glass, aluminum oxide, gallium arsenide, quartz, fused silica, indium phosphide, or other material.

Substrate thicknesses (in the z-direction in FIG. 3) can have any suitable dimensions that are appropriate for substrates' intended applications. In some embodiments substrate thicknesses taken relative to the z-direction can range from less than 100 microns to more than 2000 microns. One exemplary embodiment can utilize a substrate that is approximately 675 microns thick. Though a single substrate is discussed herein, other suitable embodiments may comprise a substrate that has multiple components during assembly and/or in the finished product.

For example one such embodiment may employ a substrate having a first component and a second sacrificial component which is discarded at some point during processing. In this particular embodiment, one or more thin-film layers 314 are positioned over substrate's second surface 303. In at least some embodiments a barrier layer 316 and an orifice plate or orifice layer 318 are positioned over the thin-film layers 314.

In one embodiment one or more thin-film layers 314 can comprise one or more electrical insulating layers such as oxides or nitrides, conductive traces (not shown) and electrical components such as resistors 320 and transistors (not shown). Individual resistors can be controlled selectively via the electrical traces. Thin-film layers 314 also can define in some embodiments, at least in part, a wall or surface of multiple fluid-feed passageways 322 through which fluid can pass. Barrier layer 316 can define, at least in part, multiple firing chambers 324. In some embodiments barrier layer 316 may define, alone or in combination with thin-film layers 314, fluid-feed passageways 322. Orifice layer 318 can define multiple firing nozzles 326. Individual firing nozzles can be aligned respectively with individual firing chambers 324.

Barrier layer 316 and orifice layer 318 can be formed in any suitable manner. In one particular implementation both barrier layer 316 and orifice layer 318 comprise thick-film material, such as a photo-imagable polymer material. The photo-imagable polymer material can be applied in any suitable manner. For example the material can be "spun-on" as will be recognized by the skilled artisan.

After being spun-on, barrier layer 316 then can be patterned to form, at least in part, desired features such as passageways and firing chambers therein. In one embodiment patterned areas of the barrier layer can be filled with a sacrificial material in what is commonly referred to as a 'lost wax' process. In this embodiment orifice layer 318 can be comprised of the same material as the barrier layer and be formed over barrier layer 316. In one such example orifice layer material is 'spun-on' over the barrier layer. Orifice layer 318 then can be patterned as desired to form nozzles 326 over respective chambers 324. The sacrificial material then is removed from the barrier layer's chambers 324 and passageways 322. Other suitable embodiments may employ an orifice layer which performs the functions of both a barrier layer and an orifice layer.

In operation a fluid, such as ink, can enter slot 305 from the cartridge body shown in FIG. 2. Fluid then can flow through individual passageways 322 into an individual chamber 324. Fluid can be ejected from the chamber when an electrical current is passed through an individual resistor 320. The electrical current can heat the resistor sufficiently to heat some of the fluid contained in the firing chamber to its boiling point so that it expands to eject a portion of the fluid from a respectively positioned nozzle 326. The ejected fluid then can be replaced by additional fluid from passageway 322.

EXEMPLARY SYSTEMS AND METHODS

Figure 4:
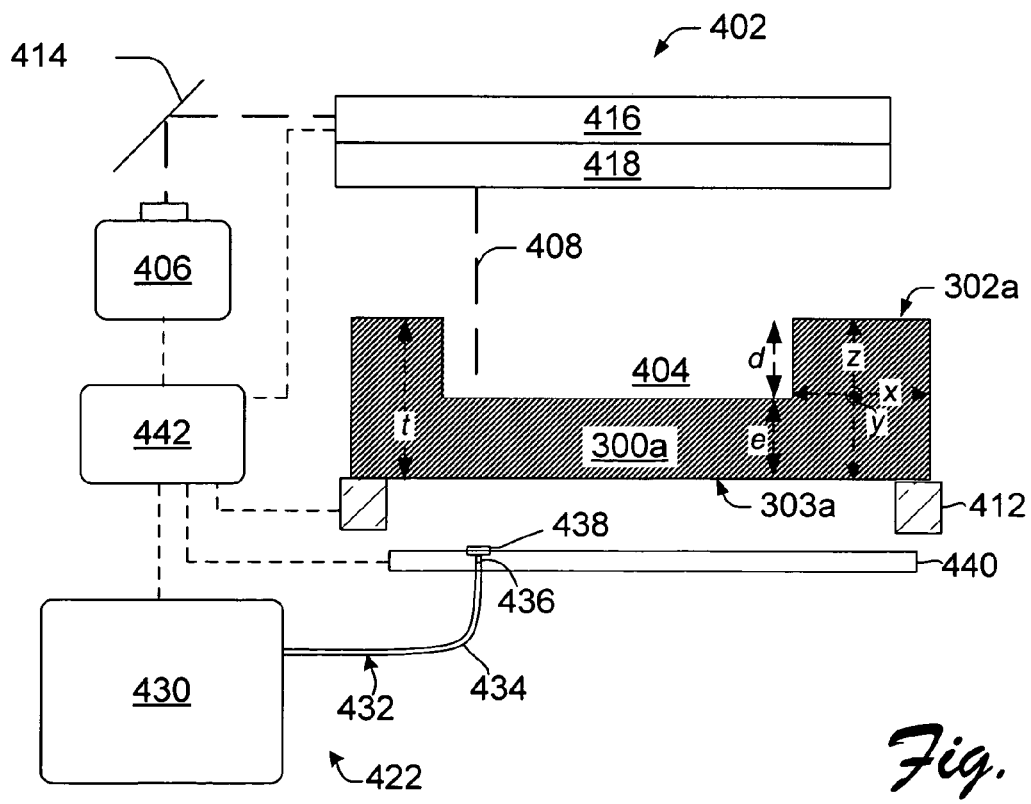
FIG. 4 illustrates a front elevational view of a representation of a processing system in accordance with one exemplary embodiment.

FIG. 4 shows a cross-sectional diagrammatic representation of an exemplary microdevice processing system 402 capable of removing material from a microdevice to form a feature therein. In this embodiment the microdevice comprises substrate 300a having a feature 404 formed in a first substrate surface 302a.

Feature 404 can have various configurations including blind features and through features. A blind feature passes through less than an entirety of the substrate's thickness t measured in the z direction. A feature which extends all the way through the thickness t becomes a through feature. A blind feature may be processed further into a through feature during subsequent processing steps. As shown in FIG. 4, feature 404 has a depth d which passes through approximately one-half of the substrate's thickness t.

In this embodiment processing system 402 comprises a means for removing substrate material. In this particular embodiment the means for removing comprises generating optical energy sufficient to remove substrate material. In this embodiment the generating means comprises a laser source 406 configured to generate laser beam 408 for laser machining substrate 300a. The laser beam can contact, or otherwise be directed at, substrate 300a.

Exemplary laser beams such as laser beam 408 can provide sufficient energy to energize substrate material at which the laser beam is directed. Energizing can comprise melting, vaporizing, exfoliating, phase exploding, ablating, reacting, and/or a combination thereof, among others processes.

Laser machining provides just one suitable embodiment for removing substrate material. Alternatively or additionally to laser machining, other embodiments can utilize one or more of a wet etching apparatus, a dry etching apparatus, and an apparatus configured to mechanically remove substrate material such as an abrasive jet apparatus and a sawing apparatus, among others. The skilled artisan should recognize that such substrate removal apparatus are known in the art.

In this embodiment substrate 300a is positioned on a fixture or stage 412 for processing. Suitable fixtures should be recognized by the skilled artisan. Some such fixtures may be configured to move the substrate along x, y, and/or z coordinates.

Various exemplary embodiments can utilize one or more mirrors 414, galvanometers 416 and/or lenses 418 to direct laser beam 408 at first surface 302a. In some embodiments laser beam 408 can be focused in order to increase its energy density to machine the substrate more effectively. In these exemplary embodiments the laser beam can be focused to achieve a desired geometry where the laser beam contacts the substrate 300a. In this embodiment laser beam 408 is directed at substrate 300a from a direction sufficient to contact first surface 302a before contacting second surface 303a.

Processing system 402 also includes a substrate measuring means which in this embodiment comprises reflectometer 422. In this embodiment the reflectometer comprises a base unit 430 and a test arm or optical launch 432. Base unit 430 can contain a reference arm, not specifically shown, but described below. In this embodiment test arm 432 comprises a fiber optic 434 extending between base unit 430 and a terminal end or fiber tip 436. A focusing lens 438 may be positioned between the fiber tip 436 and the substrate 300a. In this embodiment fiber tip 436 and/or lens 438 can be positioned by an adjustable stage 440 for relative movement between the fiber tip/lens and substrate 300a. Other embodiments may employ a fixed tip/lens and rely upon stage 412 for relative movement between the fiber tip/lens and substrate 300a.

Reflectometer 422 can generate data that can be used for measuring a dimension of substrate 300a. As illustrated in FIG. 4, the reflectometer is configured to generate data relating to a thickness of substrate material indicated generally at e and extending between second surface 303a and feature 404. In some embodiments fiber optic 434 can have a length sufficient to position fiber tip 436 proximate substrate 300a while allowing base unit 430 to be positioned sufficiently far enough from substrate 300a to be protected from contaminations generated during processing. The reference arm can be adjusted to have an optical length identical to or preferably zero to 10 cm less than the test arm. Further, in this embodiment test arm 432 is positioned below second surface 303a to measure a dimension of the substrate. In such a configuration the substrate can protect the test arm from debris created during laser processing when compared to a measuring device positioned on the side of the substrate from which the processing is occurring. Though a single substrate 300a is depicted for ease of explanation, many embodiments can employ a wafer or similar structure comprising multiple substrates.

Reflectometer 422 can be configured to generate optical energy or light of a desired wavelength. A wavelength can be selected to which the object under test, in this case substrate 300a, is transparent, or only slightly absorbing to an extent that sufficient optical energy is transmitted through substrate 300a for acceptable reflectometer operation. Simultaneously some of the light is sent to the test arm 432 and ultimately to substrate 300a and some of the light is sent to the reference arm. Of the light directed toward the substrate, varying amounts are reflected back toward the fiber tip 436. From the fiber tip, the reflected light is transmitted back to base unit 430.

In the reference arm a mirror is translated in space at the end of the reference arm effectively changing the optical length of the reference arm. When the optical length of the reference arm equals that of the optical length to a reflection source in the test arm 432, a fringe burst is measured whose strength is recorded along with the mirror position. The differential distance of the mirror recorded for each fringe burst provides the differential optical path length (differential optical path length=c*delta time/ngr where ngr is the group index of the light in that medium and c is the velocity of the light in a vacuum. Group index is defined to be the ratio of the propagation velocity of a light pulse in a vacuum relative to the velocity of propagation of a pulse in the medium) for the device under test 300a.

The strength of the fringe burst is indicative of the strength of the reflection within the device under test 300a. Fringe burst data can be utilized to determine a substrate thickness as will be described in more detail below. Various commercially available reflectometers can be utilized in various embodiments. This particular embodiment employs a low coherence precision reflectometer in the form of an Agilent 8504B precision reflectometer.

Processing system 402 further includes a controller 442 coupled to laser source 406, galvanometer 416, stage 412, reflectometer 430, and stage 440. Controller 442 can receive data from reflectometer 430 and affect various laser machining parameters. Controller 442 also can affect the functioning of reflectometer 430. Controller 442 can comprise a processor for executing computer readable instructions contained on one or more of hardware, software, and firmware. Examples of a controller such as controller 442 controlling a processing system are described below.

Figure 5:
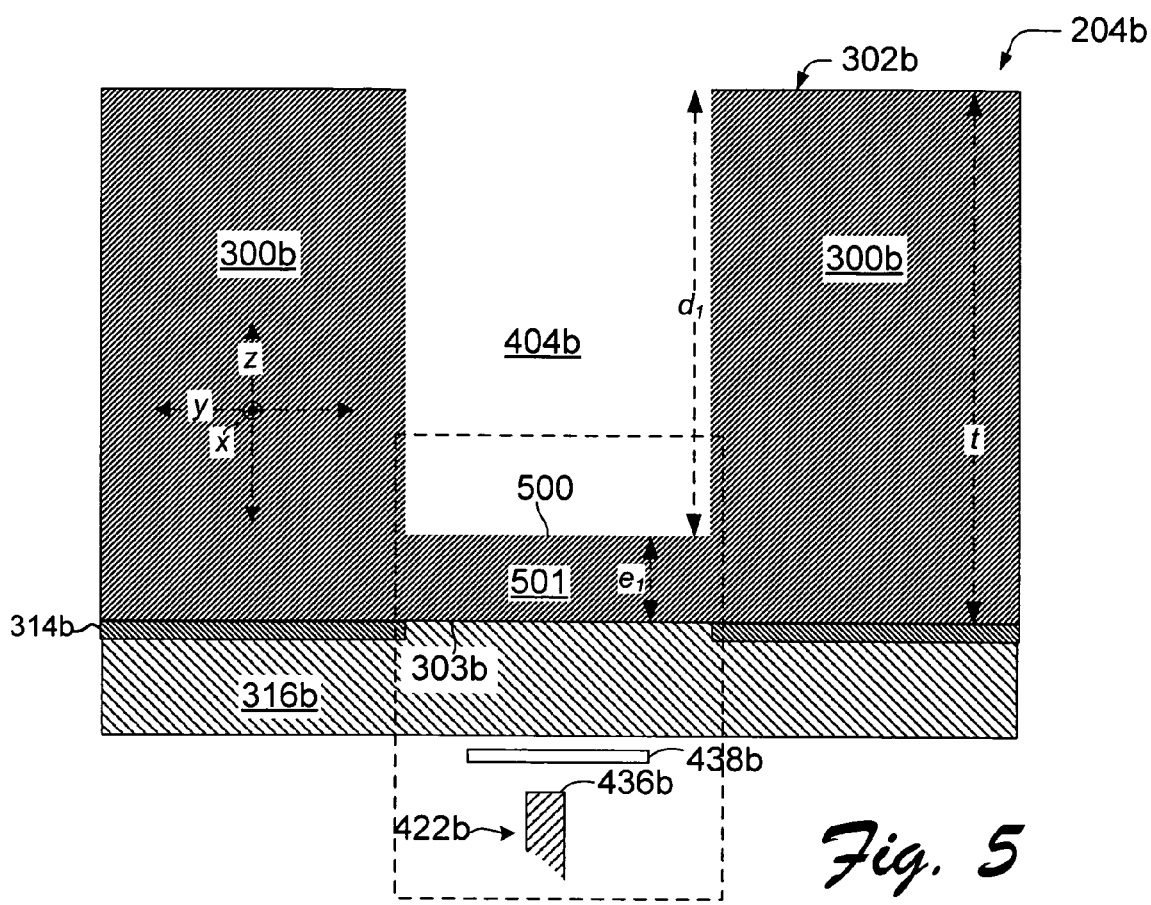
FIGS. 5-5a illustrate cross-sectional representations of a partially processed print head in accordance with one exemplary embodiment.
Figure 5A:
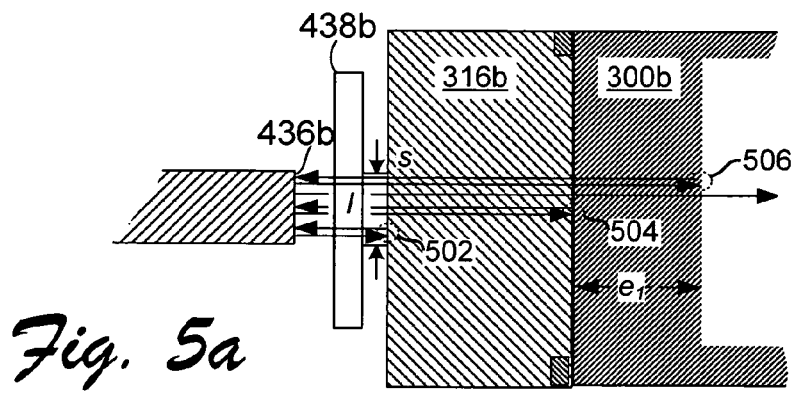
Figure 5B:
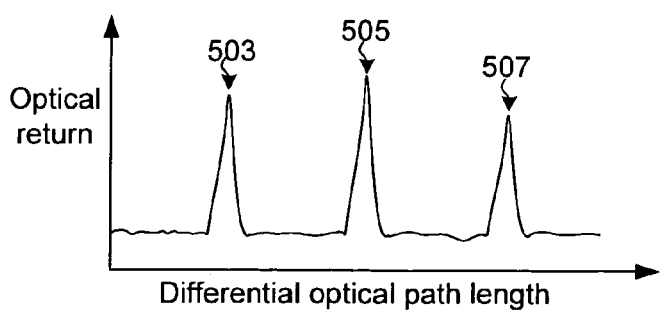
FIG. 5b illustrates a graphical representation of data generated by an exemplary reflectometer in accordance with one exemplary embodiment.

FIGS. 5-5b describe in greater detail an exemplary embodiment for measuring a dimension of a microdevice. In this instance the microdevice comprises a partially formed printhead 204b. FIG. 5 illustrates a cross-sectional view of print head 204b similar to that shown in FIG. 4. FIG. 5a illustrates an enlarged view of a portion of the print head shown in FIG. 5. For purposes of explanation, FIG. 5a is rotated 90 degrees clockwise from the view illustrated in FIG. 5. FIG. 5b illustrates a graphical representation of data, in this instance fringe burst data where for simplicity only the peaks of the interference fringes of the fringe burst are plotted, from the print head generated by the reflectometer.

FIG. 5 illustrates print head 204b comprising substrate 300b, thin-films 314b, and barrier layer 316b. Feature 404b is formed into first surface 302b and extends part way through the substrate's thickness t. Feature 404b has a depth $d_1$ between first surface 302b and a bottom surface 500. Feature 404b can be defined, at least in part, by a region or portion of substrate material 501 extending between feature 404b and second surface 303b. In this embodiment region 501 has a thickness $e_1$.

In this particular embodiment substrate 300b comprises silicon, while barrier layer 316b comprises a polymer such as Kapton. Other materials are described above in relation to FIG. 3. Reflectometer 422b terminates at fiber tip 436b positioned proximate second surface 303b and below feature 404b. Lens 438b is interposed between the fiber tip and the print head.

FIG. 5a shows an enlarged view of fiber tip 436b and a portion of print head 204b, while FIG. 5b illustrates a graphical representation of fringe burst data generated at least in part from light reflected back from the print head. Light is emitted from fiber tip 436b and is indicated generally by arrows 1. Lens 438b can focus the light on the print head in a desired spot size s. In this particular embodiment the spot size is about 80 microns. Smaller and larger spot sizes s can be utilized in various embodiments.

In this embodiment light l is selected to have a wavelength to which barrier layer 316b and substrate 300b are transparent. Some embodiments can utilize light having a center wavelength above about 1000 nanometers (nm) for these particular barrier layer and substrate materials. This particular embodiment utilizes light having a wavelength of about 1310 nm with a full-width at half maximum bandwidth of about 60 nm.

As light l travels away from fiber tip 436b portions of light or photons are reflected back into the fiber tip 436b. The reflected light travels from the fiber tip back into the reflectometer base unit as described in relation to FIG. 4. The reflected light can be converted to data for determining substrate dimensions.

Among other conditions, relatively large amounts of light l are reflected when the light encounters an interface of two materials having different indices of refraction. For example air has an index of refraction of about 1.0 while the polymer barrier layer 316b has a higher index of refraction. A relatively large amount of light reflects at the air to barrier interface indicated generally at 502 and represented generally by peak 503. Similarly, the barrier layer has a different index of refraction than silicon which is about 3.5. As such, a relatively large amount of light l reflects from this interface indicated generally at 504 and represented generally by peak 505. Further, light l encounters another interface 506 at bottom surface 500 of feature 404b that is represented generally by peak 507.

The data depicted in FIG. 5b can be utilized to determine a physical or metric dimension of a print head material. For example the measured differential optical path length of a medium can be divided by the group index of light in the medium at the known source center wavelength such as 1310 nm and multiplied by the group index in air at the known source center wavelength such as 1310 nm to determine the metric thickness of the medium. A thickness of substrate material $e_1$ can be determined utilizing the group index of the light in the silicon, the group index of light in air, and the reflectometer data indicating differential optical path length between peak 505 and peak 507. A thickness of the barrier layer can be similarly determined.

Figure 6A:
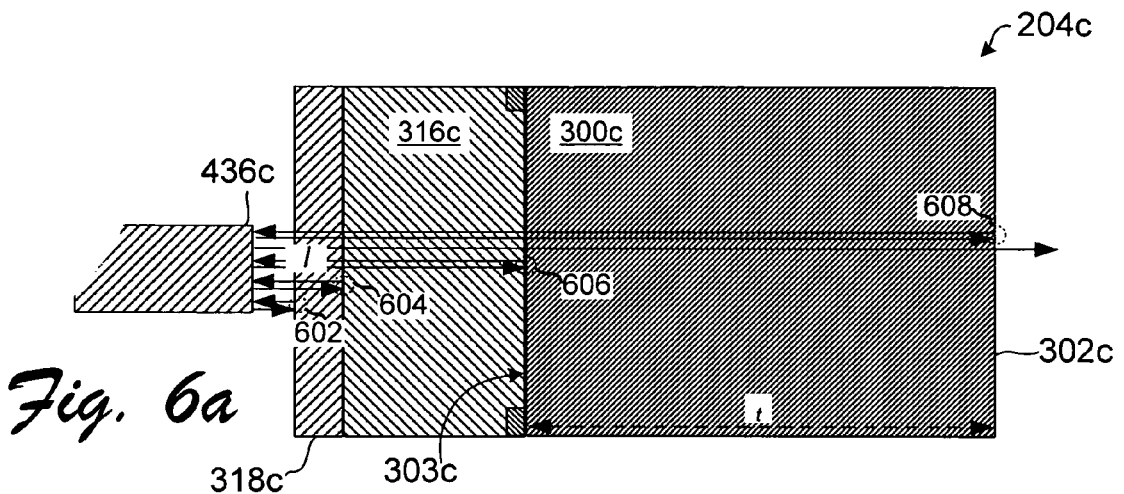
FIGS. 6a, 6c, 6e, and 6g illustrate representations of cross-sectional views of portions of an exemplary print head during processing in accordance with one exemplary embodiment.
Figure 6B:
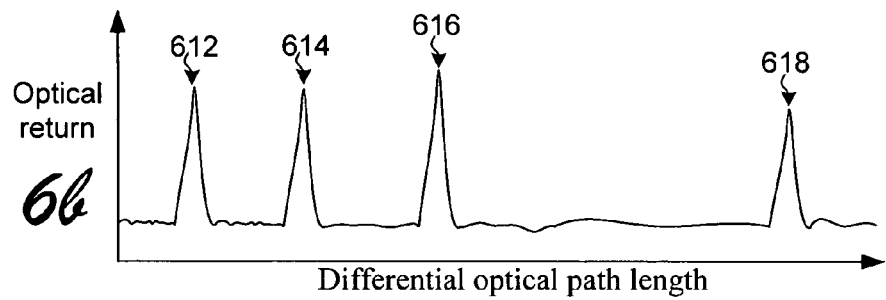
FIGS. 6b, 6d, and 6f illustrate graphical representations of data generated by an exemplary reflectometer in accordance with one exemplary embodiment.
Figure 6C:
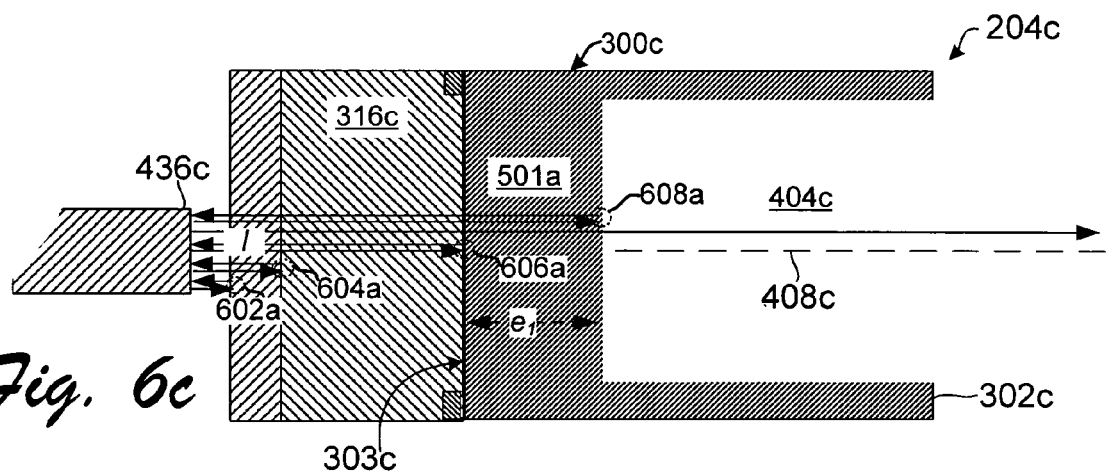
Figure 6D:
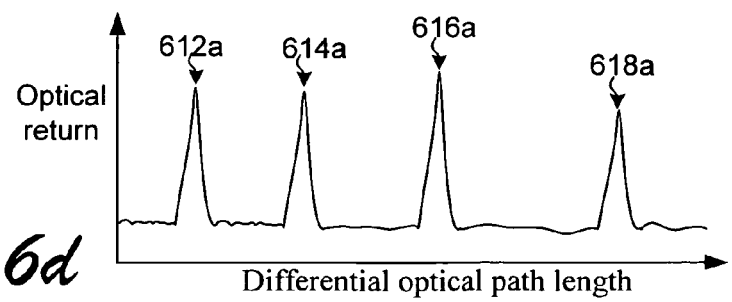
Figure 6E:
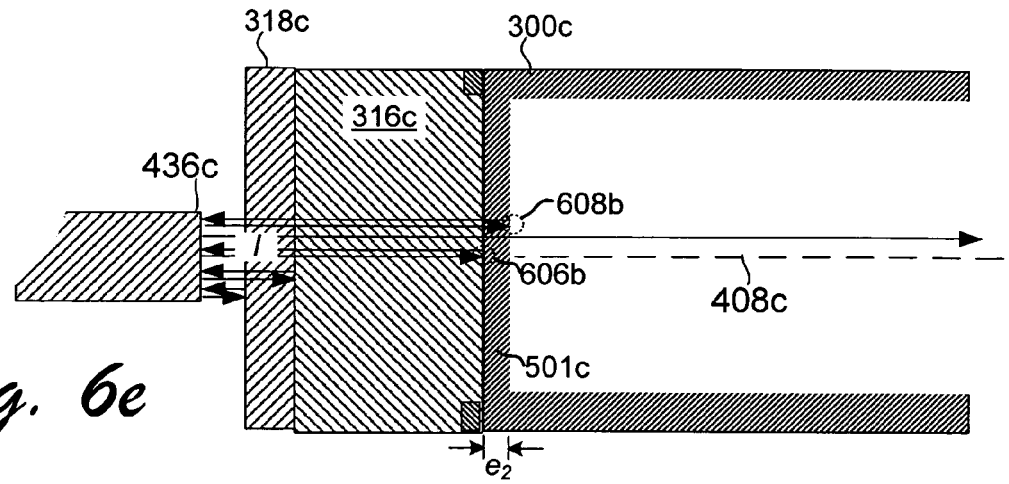
Figure 6F:
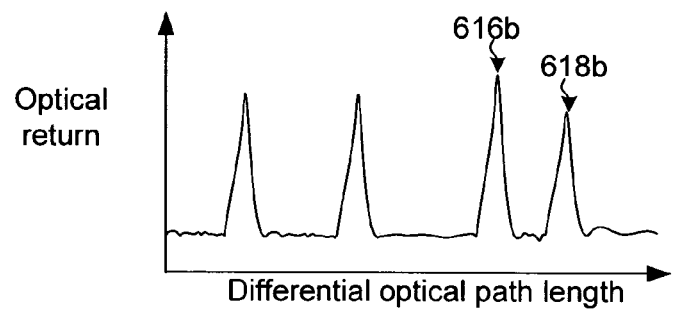

FIGS. 6a-6g show process steps for processing a microdevice where the removal process can be controlled via data from the reflectometer. For purposes of explanation only the reflectometer's fiber tip 436c is shown as illustrated in FIGS. 6a-6g. Other components of an exemplary reflectometer are described in relation to FIG. 4. FIGS. 6a, 6c, 6e and 6g show process steps during the substrate removal process. FIGS. 6b, 6d, and 6f show graphical representations of data generated by the reflectometer at the processing steps illustrated in 6a, 6c, and 6e respectively.

The reader now is referred to FIGS. 6a-6b. FIG. 6a shows a substrate 300c having a first layer comprising a polymer barrier layer 316c and a second layer comprising a polymer orifice layer 318c formed over second surface 303c. Light l emitted from fiber tip 436c can reflect back from print head 204c. Relatively high rates of reflection occur when the light contacts orifice layer 318c, barrier layer 316c, second surface 303c and first surface 302c. Theses surfaces are indicated by interfaces 602, 604, 606, and 608 respectively. The reflected light is converted to graphical data represented by FIG. 6b with peaks 612, 614, 616, and 618 relating to 602, 604, 606, and 608 respectively. Substrate thickness t can be determined based upon the graphical data of FIG. 6b and as described below in relation to FIGS. 5-5b. Similarly, barrier layer 316c and orifice layer 318c thicknesses also can be determined.

The reader now is referred to FIGS. 6c-6d. FIG. 6c illustrates print head 204c after feature 404c is formed in substrate 300c. In this particular embodiment laser beam 408c removes substrate material to form the feature. Alternatively or additionally other substrate removal techniques can be utilized. Interfaces 602a, 604a, 606a, and 608a correspond to peaks 612a, 614a, 616a and 618a shown in FIG. 6d. Peaks 612a, 614a, 616a remain in essentially the same relative locations along the time axis as peaks 612, 614, and 616 illustrated in FIG. 6b. In contrast, peak 618a is shifted left toward peak 616a relative to peak 616 of FIG. 6b. While the distance between peaks 616 and 618 represented a substrate thickness t between second surface 303c and first surface 302c, the distance between peaks 616a and 618a represent thickness $e_1$ of region 501a. This data can provide additional information. For example if the data of FIG. 6b indicates that substrate thickness t equals 675 microns and FIG. 6d indicates thickness $e_1$ is 185 microns then 490 microns of material was removed to form feature 404c. If laser beam 408c made 30 passes over substrate 300c then laser beam 408c is removing an average of 16.33 microns of substrate material per pass. Such information can be utilized to control a processing system such as processing system 402a described in relation to FIG. 4.

FIGS. 6e-6f illustrate a subsequent process step where additional substrate material is removed. Peaks 616b, 618b corresponding to interfaces 606b, 608b respectively, indicate that region 501c has a thickness $e_2$ of 30 microns. A controller as described in relation to FIG. 4 can utilize the graphical data of FIGS. 6b, 6d, and 6f to control laser functioning. For example in one embodiment where design parameters indicate that the laser machining process should leave a substrate thickness e of 20-33 microns defining feature 404c the data regarding thickness e and substrate removal per laser pass can be utilized to determine a number of additional laser passes.

Other embodiments may utilize the reflectometer data to control the removal process. For example, when the reflectometer data indicates that thickness e reaches a predetermined value such as 30 microns, the controller can cause the laser source to generate laser beam 408c at a lower power that removes less substrate material per pass so that a more precise thickness parameter can be achieved. Maintaining more precise parameters can contribute to print head quality and uniformity. For example some print head fabrication processes may want to remove as much substrate material with laser beam 408c as possible without breaking through the substrate's second surface 303c. If the laser beam breaks through the substrate it may damage the underlying layers. A second removal process may be utilized to remove additional substrate material and/or to finish the feature to form a through feature or slot. One such example can be seen in FIG. 6g where feature 404c comprises a slot through substrate 300c and barrier layer 316c. The slot can supply fluid to firing chambers (not shown) formed in the barrier layer. The fluid ultimately can be ejected from nozzles positioned over the firing chambers as described in relation to FIG. 3.

Figure 6G:
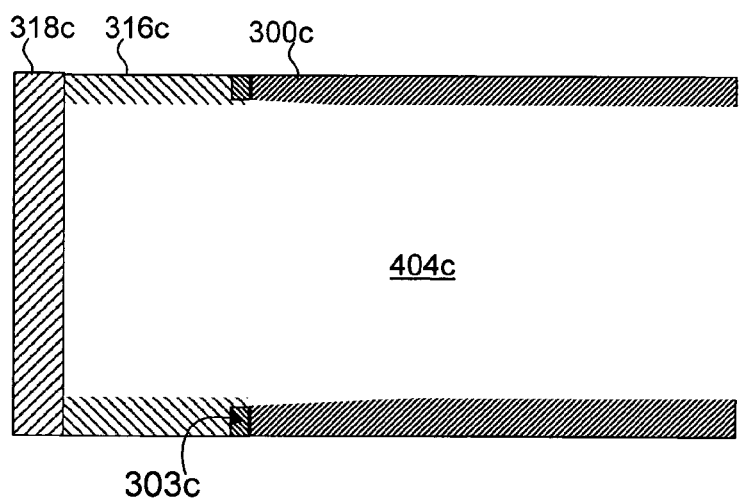

FIG. 6g shows print head 204b where a second substrate removal process removes additional substrate material and portions of the barrier layer. In this particular embodiment the second substrate removal process comprises wet etching, though other embodiments can utilize other removal techniques. The wet etching process can produce higher quality and more uniform print heads when utilized on print heads having a uniform and known substrate thickness e between feature 404c and second surface 303c. The described embodiments can attain higher uniformity and attain closer tolerance parameters utilizing the data generated by the reflectometer.

The above embodiments are described in the context of providing data regarding dimensions of microdevice components. Some embodiments can alternatively or additionally be utilized to determine relative locations of structures of a microdevice. FIGS. 7a-7f illustrate one such example.

Figure 7A:
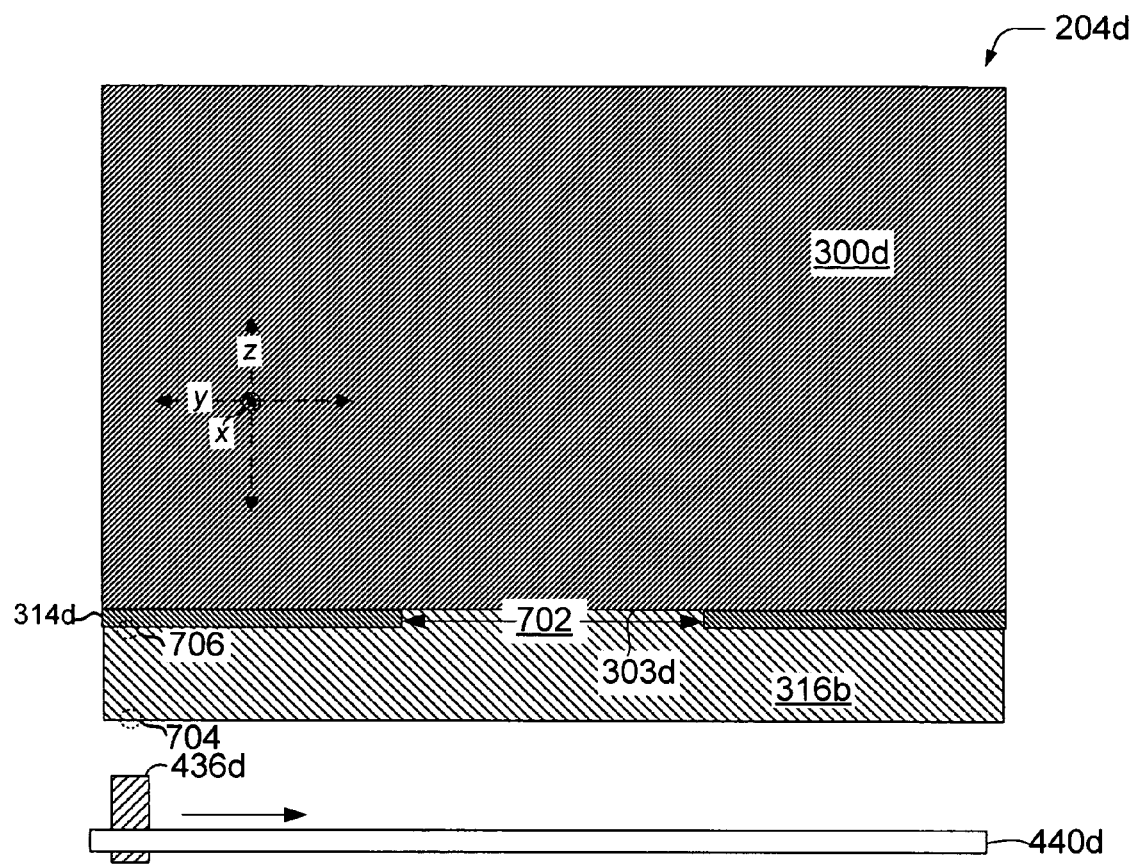
FIGS. 7a, 7c, and 7e, illustrate representations of cross-sectional views of portions of an exemplary print head during processing in accordance with one exemplary embodiment.
Figure 7B:
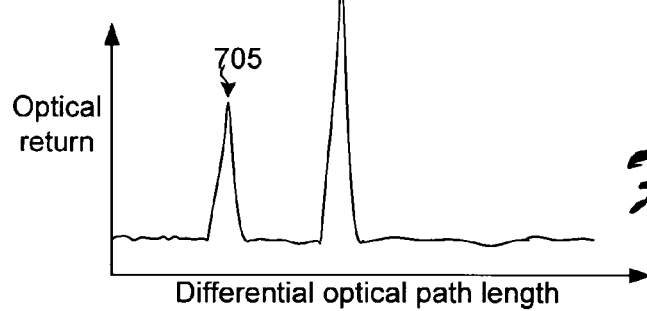
FIGS. 7b, 7d, and 7f illustrate graphical representations of data generated by an exemplary reflectometer in accordance with one exemplary embodiment.

FIG. 7a illustrates a print head substrate 300d having thin films 314d and barrier layer 316d formed over second surface 303d. Thin films 314d were patterned to provide an area 702 through which a slot can be formed. In this instance thin-films 314d comprise at least some material, such as various metals among others, which is substantially opaque to light emitted from the reflectometer.

Reflectometer's fiber tip 436d can be positioned relative to print head 204d by fixture 440d. To determine the location of area 702 fixture 440d can position fiber tip 436d at one extreme of the print head. For example to determine the location of area 702 in the y-direction, fiber tip 436d can be positioned at the extreme left or right side of the print head. As illustrated in FIG. 7a fiber tip 436d is positioned at the extreme left side.

When light is reflected from interface 704 at the first surface of barrier layer 316d a peak 705 is generated. When light is reflected from interface 706 at thin-films 314d a second peak 707 is generated. Since essentially no light passes through thin film 314d no subsequent peaks occur.

Figures 7C, 7D:
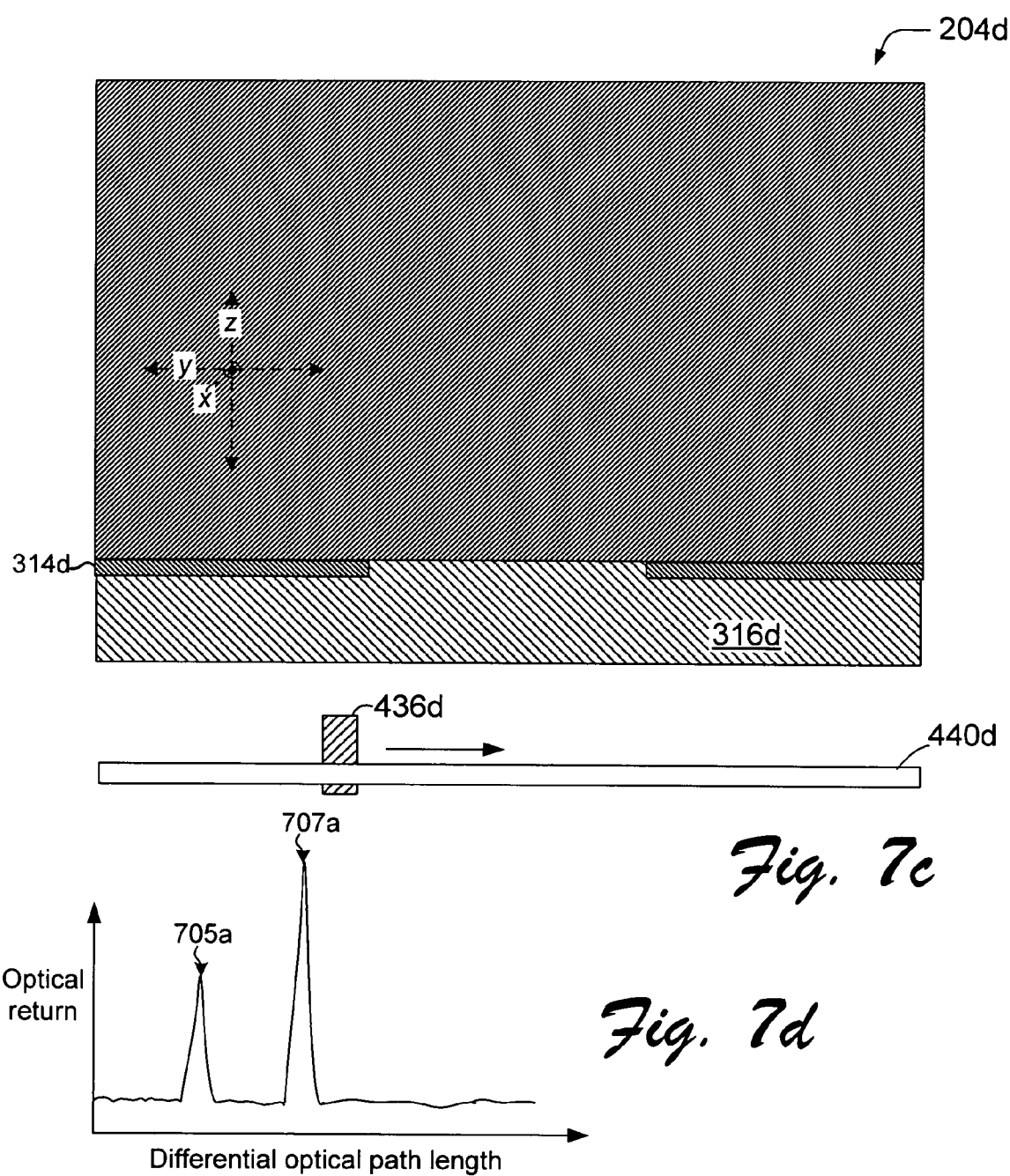

FIGS. 7c-7d illustrate print head 204d where fixture 440d moved fiber tip 436d to the right, but still below thin film material 314d. Peaks 705a, 707a indicated in FIG. 7d essentially match those of FIG. 7b.

Figure 7E:
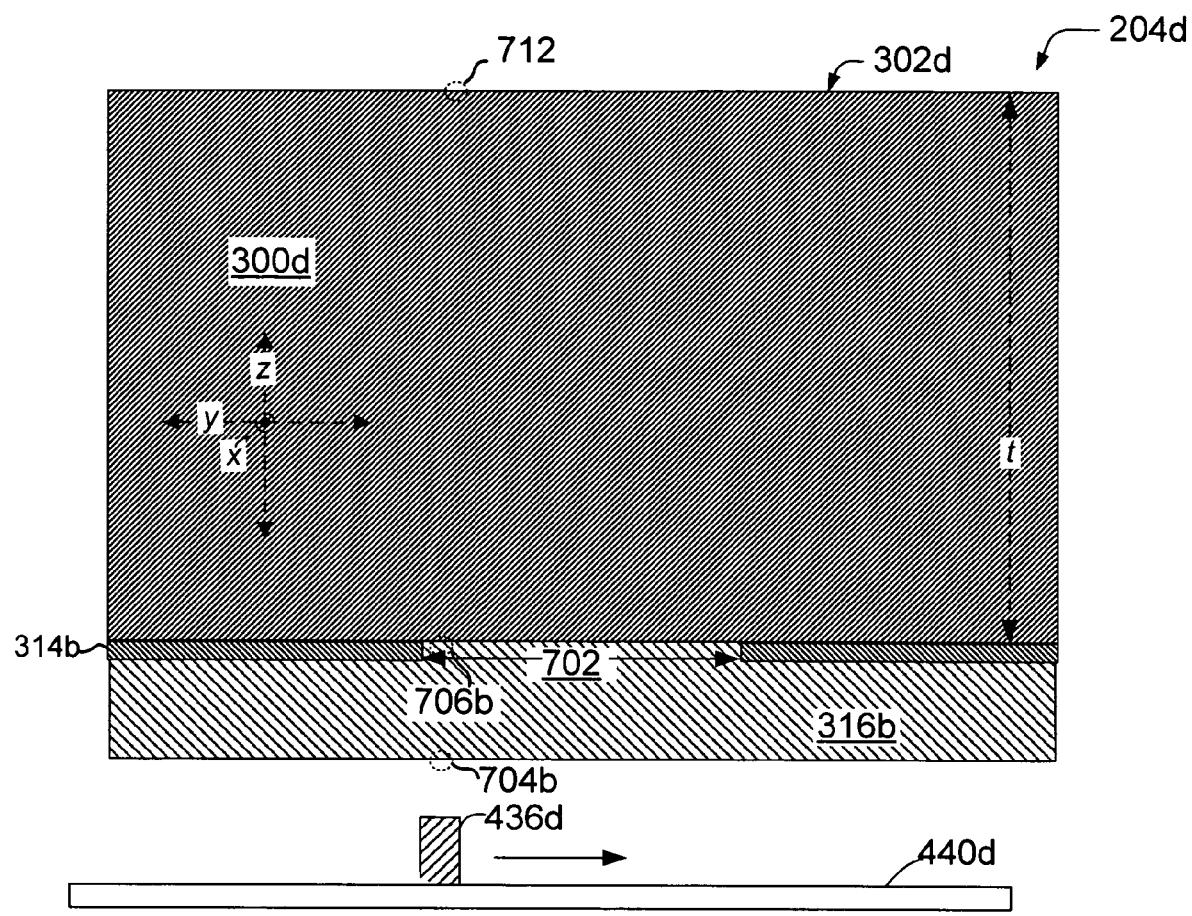
Figure 7F:
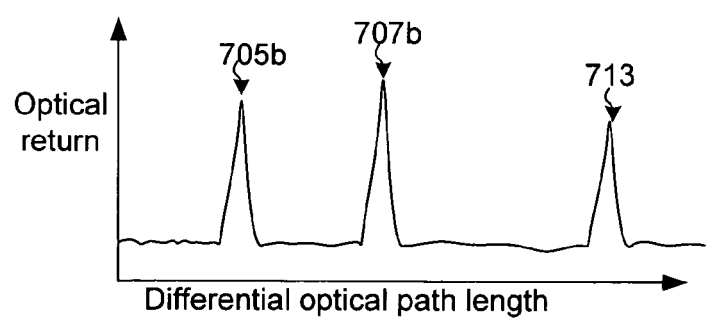

FIG. 7e-7f illustrate print head 204d where fixture 440d moved fiber tip 436d further to the right. Light from the fiber tip will now reflect from interfaces 704b, 706b and 712. These interfaces are represented by peaks 705b, 707b and 713 respectively. Similarly, more data can be generated by moving the fiber tip progressively to the right. An edge of the print head can be determined by scanning and moving until the data indicates no reflection associated with the print head. The data indicating the location of the area can be utilized by a controller to guide or otherwise to effect substrate removal to ensure proper alignment of a feature relative to the area. A similar technique can be employed in the x-direction to determine the relative x-dimensional location of area 702. A grid pattern also can be mapped out by making multiple passes in the x and y directions with the reflectometer. Such an example is discussed below in relation to FIGS. 8-8a.

Figure 8:
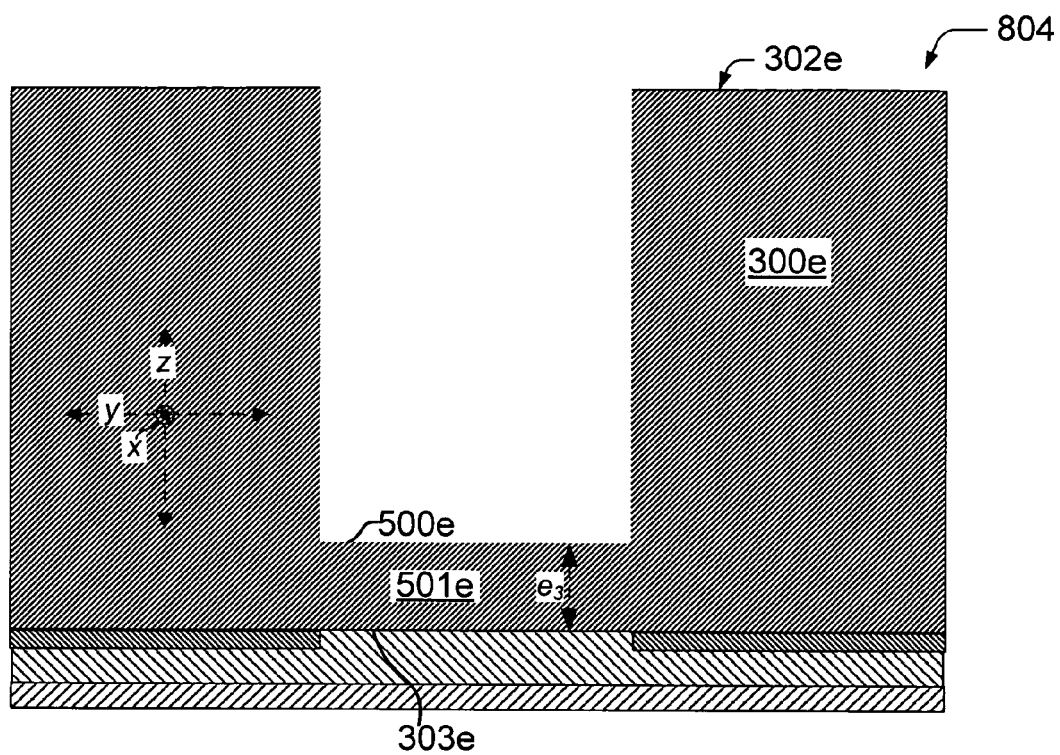
FIG. 8 illustrates a cross-sectional representation of a partially processed print head in accordance with one embodiment.
Figure 8A:
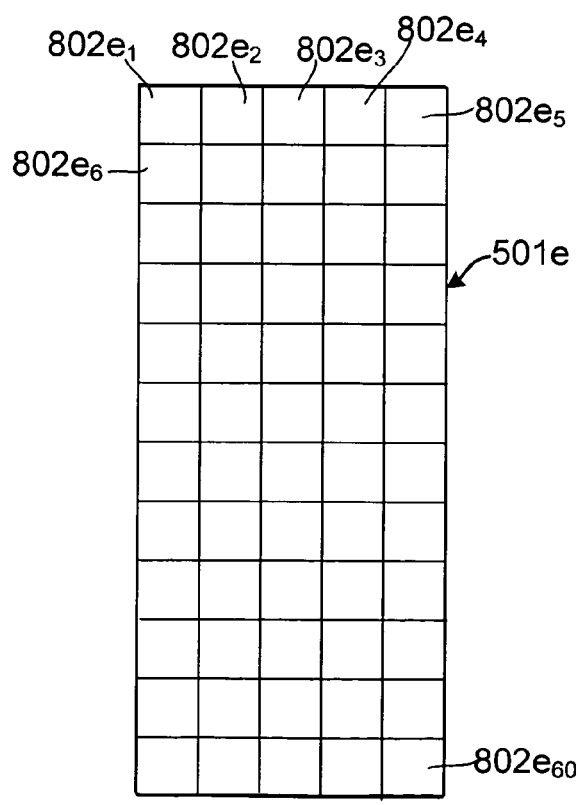
FIG. 8a illustrates a top view representation of sub-units of a region of a substrate in accordance with one embodiment.

FIGS. 8-8a illustrate a further embodiment which combines embodiments described above to produce data which can map thickness $e_3$ of multiple subunits of region 501e of a microdevice 804. In this embodiment region 501e can be defined between bottom surface 500e and second surface 303e of substrate 300e. In this particular embodiment the subunits comprise 60 subunits $802e_1$-$802e_{60}$ though for purposes of clarity they are not all specifically labeled. Other embodiments may map the thickness into more or less subunits than the 60 subunits comprising this embodiment.

Reflectometer's fiber tip 436e can be moved over second surface 303e along the x-axis, y-axis and/or combination thereof for positioning proximate the various subunits. An example of moving the fiber tip relative to the substrate and along the y-axis is provided above in relation to FIGS. 7a-7g. The fiber tip can then be repositioned in the x-direction and the process described above repeated. Other mapping methods should be recognized by the skilled artisan. The data generated by this movement or mapping can be utilized by a controller to effect further processing of individual sub-units 802e. For example, if an individual sub-unit $802e_1$ has a thickness greater than a predetermined tolerance value then further processing can be conducted on that sub-unit such as with a laser beam. Sub-units $802e_2$ and $802e_3$ which fall within the tolerance value would not receive additional substrate removal.

Some embodiments could remap region 501e until all subunits 802e fell within the predetermined tolerance value. The skilled artisan should recognize other embodiments. The embodiment described relative to FIGS. 8-8a could also be utilized to map one or more surfaces of a wafer for deviations from a desired planarity. Any deviation could be utilized by a controller to adjust various processing techniques.

Although the inventive concepts have been described in language specific to structural features and methodological steps, it is to be understood that the appended claims are not limited to the specific features or steps described. Rather, the specific features and steps are disclosed as preferred forms of implementing the inventive concepts.

What is claimed is:

1. A system for forming a print head comprising a substrate, a barrier layer formed on the substrate, and an orifice plate formed on the barrier layer, the system comprising:
    means for directing light at a first side of the print head to remove substrate material sufficient to form a slot in the substrate;
    means for directing light at a second side of the print head opposite to the first side, the means for directing light at the second side being configured to generate light that passes through the orifice plate, the barrier layer, and the substrate;
    means for detecting reflected light at least a portion of which is reflected from within the print head; and
    means for determining a thickness of a portion of the substrate that defines the slot based at least in part on data generated from the reflected light;
    wherein the means for directing light at the first side is configurable to be controlled at least in part by the generated data.

2. The system of claim 1, wherein the means for determining can further control the functioning of the means for directing light at the first side, at least in part, based on the thickness.

3. The system of claim 1, wherein the means for determining comprises hardware and software.

4. The system of claim 1, wherein the means for determining comprises hardware and firmware.

5. The system of claim 1, wherein the means for directing light at a first side is further configured to form a slot in the barrier layer and wherein the means for determining a thickness is further configured to determine the thickness of the barrier layer.

6. A system for forming a print head comprising a substrate, a barrier layer formed on the substrate, and an orifice plate formed on the barrier layer, the system comprising:
    a laser source configured to generate a laser beam for forming a slot in the substrate, the laser source being configured to be directed at the print head from a first side of the print head so as to contact the substrate before contacting the barrier layer; and,
    a reflectometer configured to direct optical energy at a second side of the print head opposite the first side such that the optical energy passes through the orifice plate, the barrier layer, and the substrate to enable measurement of a thickness of substrate material remaining adjacent the slot.

7. The system of claim 6, wherein the reflectometer comprises a processor configured to control the laser source based, at least in part, on the thickness.

8. The system of claim 6 further comprising a controller coupled to the reflectometer and the laser source and configured to control the laser source based, at least in part, on data received from the reflectometer.

9. The system of claim 6, wherein the reflectometer comprises a base unit and an optical launch.

10. The system of claim 9, wherein the optical launch comprises an optical fiber extending from the base unit to a fiber tip, and wherein the fiber tip is positioned below a fixture on which the print head is positioned for laser machining.

11. The apparatus of claim 6, wherein the laser source is further configured to form a slot in the barrier layer and wherein the reflectometer is further configured to enable measurement of a thickness of the barrier layer.

12. A print head processing method for forming a print head comprising a substrate, a barrier layer formed on the substrate, and an orifice plate formed on the barrier layer, the method comprising:

forming a slot in the substrate by removing substrate material from a first side of the print head with a laser;

directing light a second side of the print head opposite to the first side such that the light passes through the orifice plate, the barrier layer, and the substrate;

detecting reflected light at least a portion of which is reflected from within the print head; and, determining a thickness of substrate material adjacent the substrate slot based at least in part on data generated from the reflected light.

13. The method of claim 12, wherein the directing comprises directing light having a wavelength to which the print head is transparent.

14. The method of claim 12, wherein the determining is based at least in part on the data and a velocity of propagation of a light pulse in the substrate.

15. The method of claim 12, further comprising referring to the determined thickness to determine when to stop removing material.

16. The method of claim 12, wherein forming a slot in the substrate comprises forming a slot that extends through the substrate from a first surface to a second surface of the substrate, the method further comprising forming a slot in the barrier layer and determining a thickness of barrier layer material adjacent the barrier layer slot at least in part on data generated from the reflected light.

* * * * *